(12) United States Patent
Juang et al.

(10) Patent No.: US 7,226,643 B2
(45) Date of Patent: Jun. 5, 2007

(54) THERMAL PYROLYSISING CHEMICAL VAPOR DEPOSITION METHOD FOR SYNTHESIZING NANO-CARBON MATERIAL

(75) Inventors: Zhen-Yu Juang, Taipei (TW); Teng-Fang Kuo, Kaohsiung (TW); Chuen-Horng Tsai, Hsinchu (TW); I-Nan Lin, Taipei (TW)

(73) Assignee: National Science Council, Taipei, Taiwan (CN)

( * ) Notice: Subject to any disclaimer, the term of this patent is extended or adjusted under 35 U.S.C. 154(b) by 478 days.

(21) Appl. No.: 10/341,887

(22) Filed: Jan. 13, 2003

(65) Prior Publication Data

US 2003/0138561 A1 Jul. 24, 2003

(30) Foreign Application Priority Data

Jan. 14, 2002 (TW) .................. 91100409 A

(51) Int. Cl.
*H05H 1/24* (2006.01)
(52) U.S. Cl. .............. 427/577; 427/249.1; 427/240; 427/282; 204/192.1
(58) Field of Classification Search ............ 427/249.1, 427/577, 240, 282; 204/192.1
See application file for complete search history.

(56) References Cited

U.S. PATENT DOCUMENTS

| | | | | |
|---|---|---|---|---|
| 5,164,363 A * | 11/1992 | Eguchi et al. | ............... | 505/447 |
| 6,110,531 A * | 8/2000 | Paz de Araujo et al. | .......... | 427/255.25 |
| 6,123,993 A * | 9/2000 | Xu et al. | .................. | 427/255.6 |
| 6,204,084 B1 * | 3/2001 | Sugiura et al. | ............... | 438/46 |
| 6,258,407 B1 * | 7/2001 | Lee et al. | .............. | 427/255.28 |
| 6,333,016 B1 * | 12/2001 | Resasco et al. | .......... | 423/447.3 |
| 6,387,844 B1 * | 5/2002 | Fujishima et al. | .......... | 502/350 |
| 6,759,305 B2 * | 7/2004 | Lee et al. | ................... | 438/399 |
| 2002/0127170 A1 * | 9/2002 | Hong et al. | .............. | 423/447.3 |
| 2004/0265212 A1 * | 12/2004 | Varadan et al. | .......... | 423/447.3 |

\* cited by examiner

*Primary Examiner*—Bret Chen
(74) *Attorney, Agent, or Firm*—Michael B. Fein; Cozen O'Connor

(57) ABSTRACT

A thermal cracking chemical vapor deposition method for synthesizing a nano-carbon material is provided. The method includes steps of (a) providing a substrate, (b) spreading a catalyst on the substrate, (c) putting the substrate into a reactor, (d) introducing a carbon containing material, and (e) heating the carbon containing material, thereby the carbon containing material being cracked to provide a carbon source for forming the nano-carbon material on the substrate.

23 Claims, 6 Drawing Sheets

THERMAL PYROLYSISING CHEMICAL VAPOR DEPOSITION METHOD FOR SYNTHESIZING NANO-CARBON MATERIAL

FIELD OF THE INVENTION

This invention relates to a method for synthesizing a nano-carbon material, and more particularly to a thermal pyrolysising chemical vapor deposition method by means of employing microwave.

BACKGROUND OF THE INVENTION

Presently, the method for growing a nano-carbon material includes three types: one is an arc-discharge method, another is a material mixed by metal and graphite, which are vaporized via laser vaporization, and the other is a CCVD (Catalytic Chemical Vapor Deposition) method.

The arc-discharge method is described as follows introducing helium into a stainless steel reactor which maintains the pressure at 500 Torr, connecting a DC power to the two graphite electrodes in the reactor to provide a voltage at 20 V, and forming arcs when two electrodes are close enough, and the produced current is about 150 A. After a period of time, there finds some materials containing carbon deposited on the cathode and also the reactor. Those deposited on the cathode are the mixture of nano-carbon material, carbon granules, fullerences, and a large amount of amphorous carbons. The advantages of the arc-charge method include the simple apparatus, and the fast speed for producing the nano-carbon material. But the disadvantage of the arc-charge method is a large amount of impurities are mixed therein. The complicated purification processes must be executed to purify thereof, and it is an improper method for producing the nano-carbon material with high purity.

The laser vaporization employs a high power laser to shoot the target, which is made of catalytic metal and carbon, and then vaporizes it. Continuously, an inert gas (e.g., helium or neon) is introduced to bring thereof into the high temperature reactor to form the nano-carbon material on the substrate which is located at the exit having a lower temperature of the reactor. The advantage of this method is that the purity of the nano-carbon material can be achieved up to 90%. But the disadvantage of the laser vaporization is a very low production rate and thus is unsuitable for mass production.

The CCYD (Catalytic Chemical Vapor Deposition) method is trying to introduce the hydrocarbon (mostly are $CH_4$, $C2H_2$, $C_2H_4$, and $C_6H_6$, and generally also mixed with hydrogen) or the carbon monoxide into a one- or multi-stages high temperature reactor to produce the thermal pyrolysising on some catalytic metals. The products might be a nano-carbon material, an amphorous carbon, or a full carbon fiber. The advantage of this method is that an orientated nano-carbon material can be grown via the pre-treatment of the substrate and the catalytic metal to benefit the fabrication of the element. The disadvantage of this method is that the adhesion between the substrate and the nano-carbon material is bad. Generally, the temperature raising speed of a high temperature reactor is slow and the temperature climbing status of large surfaces is uneven, thus maximizing the reaction area of the process and achieving a mass production all will be limited by the conditions of the high temperature reactor.

Besides, the methods described above all are high temperature processes (700~1200° C.). Because of the high temperature of these methods, they cannot be matched to the silicon semiconductor manufacturing process which is already commercialized.

Besides, the methods described above all are high temperature processes (700~1200° C.). Because of the high temperature of these methods, they cannot be matched to the silicon semiconductor manufacturing process which is already commercialized.

Because of the technical defects described above, the applicant keeps on carving unflaggingly to develop "thermal pyrolysising chemical vapor deposition method for synthesizing nano-carbon material" through wholehearted experience and research.

SUMMARY OF THE INVENTION

It is an object of the present invention to provide a thermal pyrolysising chemical vapor deposition method which employs microwave to heat.

It is another object of the present invention to provide a microwave heating method which pyrolyzes an organic gas to form a carbon material or carbon source in nano size on a substrate which is already catalyst covered.

It is another object of the present invention to provide a microwave heating method which pyrolyzes an organic gas to form a carbon material or carbon source in nano size on a substrate which is already catalyst covered.

According to an aspect of the present invention, a thermal pyrolysising chemical vapor deposition method for synthesizing a nano-carbon material includes steps of: (a) providing a substrate; (b) spreading a catalyst on the substrate; (c) putting the substrate into a reactor; (d) introducing a carbon containing material; and (e) heating the carbon containing material, thereby the carbon containing material being pyrolysised to provide a carbon source for forming the nano-carbon material on the substrate.

Certainly, the catalyst in step (b) can be one selected from a group consisting of a transition element, a compound thereof and a mixture thereof.

Certainly, the spreading method in step (b) can be one selected from a group consisting of a spin coating method, a screen printing method, a physical vapor deposition (PVD) method, a chemical vapor deposition (CVD) method, and a mixed membrane plating method thereof.

Preferably, the step (b) further includes a step of (b1) providing a heat generator.

Preferably, the heat generator in step (b1) is made of a material being able to absorb microwave and transform microwave energy into heat energy.

Preferably, the heat generator in step (b1) is made of silicon carbide.

Preferably, the heat generator in step (b1) is putted into the reactor together with the substrate.

Preferably, the carbon containing material in step (d) is a gas.

Preferably, the gas is an organic gas.

Certainly, the organic gas can be one selected from a group consisting of methane, acetylene, and a gas compound containing carbon.

Preferably, the heating step is executed by a microwave-heating method.

Preferably, the microwave-heating meted is executed by introducing the microwave into the reactor to employ the heat generator to generate a heat energy corresponding to the microwave and to pyrolysis the carbon containing material.

Preferably, the heat energy is formed by an induced current generated by the heat generator in response to the microwave.

Preferably, the heat energy is formed by an arc-discharge generated by the heat generator in response to the microwave.

In accordance with another aspect of the present invention, a microwave thermal deposition method includes steps of: (a) providing a substrate; (b) providing a heat generator; (c) putting the substrate together with the heat generator into a reactor; (d) introducing a material into the reactor; and (e) introducing a microwave into the reactor to employ the heat generator to generate a heat energy in response to the microwave and to pyrolysis the material for providing a material source when growing a substance on the substrate.

Preferably, the step (a) further includes a step of (a1) spreading a catalyst on the substrate.

Certainly, the catalyst can be one selected from a group consisting of a transition element, a compound thereof and a mixture thereof.

Certainly, the spreading method can be one selected from a group consisting of a spin coating method, a screen printing method, a physical vapor deposition (PVD) method, a chemical vapor deposition (CVD) method, and a mixed membrane plating method thereof.

Preferably, the heat generator in step (b) is made of a material being able to absorb the microwave and transform microwave energy into heat energy.

Preferably, the heat generator is made of silicon carbide.

Preferably, the material in step (d) is a carbon containing material.

Preferably, the carbon containing material is a gas.

Preferably, the gas is an organic gas.

Certainly, the organic gas can be one selected from a group consisting of methane, acetylene, and a gas compound containing carbon.

Preferably, the heat energy in step (e) is formed by an induced current generated by the heat generator in response to the microwave.

Preferably, the heat energy in step (e) is formed by an arc-discharge generated by the heat generator in response to the microwave.

Preferably, the substance in step (e) is a nano-carbon material.

Preferably, the material in step (c) is made of carbon.

Preferably, the substrate is a foundation for growing the substance.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

Figure 1:
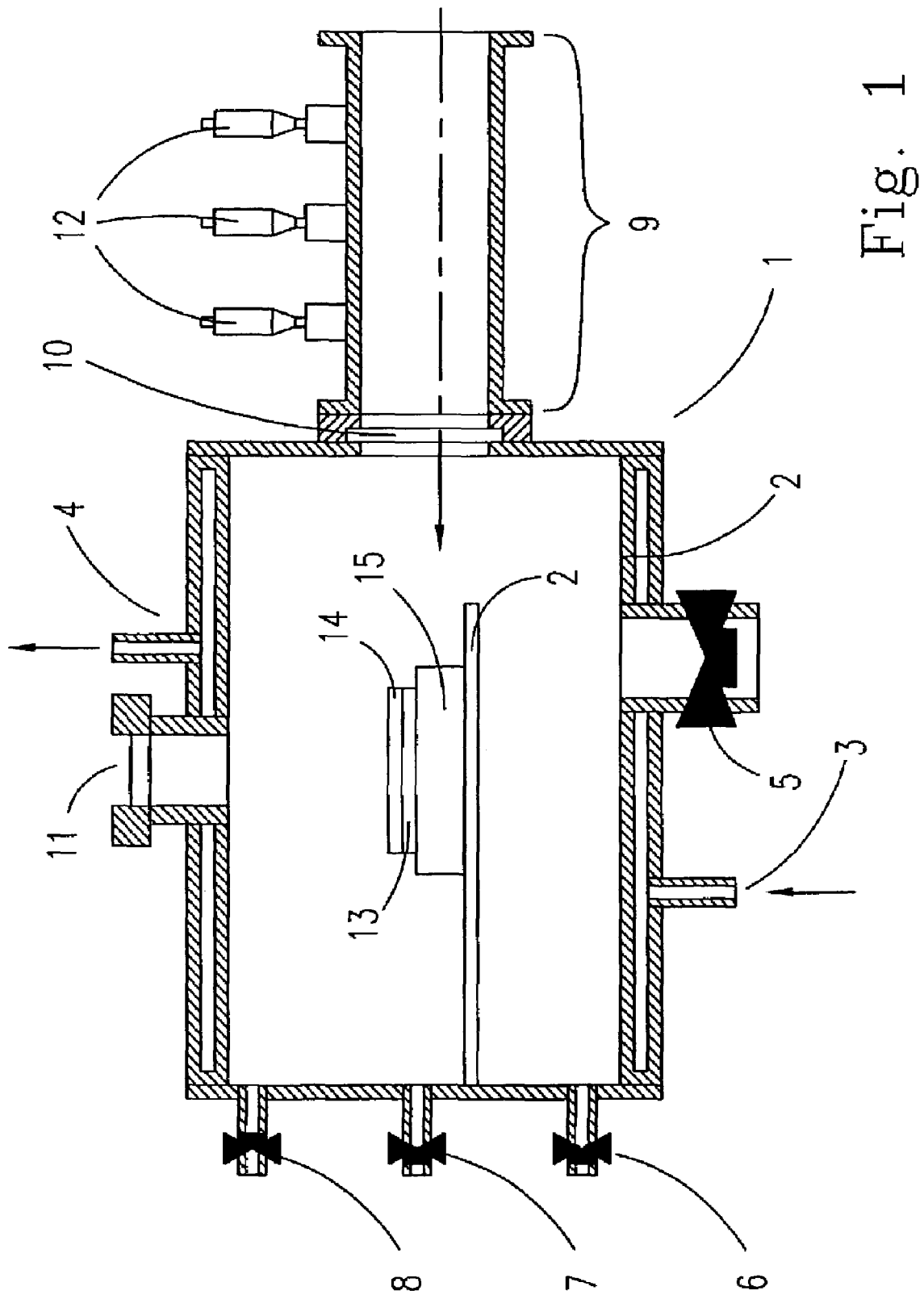
FIG. 1 is a schematical view of the manufacturing apparatus of the nano-carbon material according to the present invention.

Please refer to FIG. 1. FIG. 1 shows a schematical view of the manufacturing apparatus of the nano-carbon material. The apparatus includes a reactor 1, a salver 2, an entrance of cooling water 3, an exit of cooling water 4, an air-extracting valve gate 5, an air-exhausting valve gate 6, an air-entering gate 7, an air-exiting gate 8, a wave conduit 9, a quartz glass plate 10, an infrared ray temperature detecting window 11, and a microwave modulation knob 12.

Firstly, a substrate 13 is fully covered by a catalyst 14. Then, a heat generator 15 is putted on the salver 2, wherein the heat generator 15 is made of a material (e.g., silicon carbide) which can absorb microwave and then transmit the microwave energy to the thermal energy. Also, the heat generator 15 is a holder for the substrate 13, or the substrate 13 can be positioned above or around the heat generator 15. Continuously, the air-extracting valve gate 5 is opened to vacuum the reactor 1 for completely removing the air in the reactor 1, so that a dangerous reaction between the residuary oxygen and an organic gas can be avoided. Sequentially, cooling water is poured into the reactor 1 through the entrance of cooling water 3, wherein the flowing direction of the cooling water is poured via the entrance of cooling water 3 and drained through the exit of cooling water 4. Then, the air-extracting valve gate 5 is closed and sequentially the air-entering gate 7 is opened for pouring the organic gas (e.g., methane ($CH_4$), acetylene ($C_2H_2$), or other carbon containing compounds) into the reactor 1. The pressure of the reactor 1 is raised to 1 atm, and sequentially the air-exhausting valve gate 6 is opened for adjusting the flow rate of the organic gas. The power supply of the microwave is opened, so that the microwave can be transmitted into the reactor via passing through the wave conduit 9 and the quartz glass plate 10. The output power of the microwave is increased 50W each time. The temperature of the reactor 1 is detected by an infrared ray detector through the infrared ray temperature detecting window 11 and is controlled by adjusting the output power of the microwave. When the desirable temperature of the heat generator 15 (silicon carbide (SiC)) is achieved, the microwave modulation knob 12 will be adjusted to minimize the amount of the reflecting microwave so as to stop the power increase. At this time, the heat generator 15 is under red and hot condition. After the growth of the nano-carbon material is completed, the power of the microwave, the air-entering gate 7, and the air-exhausting valve gate 6 are sequentially closed and the air-extracting valve gate 5 is then reopened for vacuuming the reactor 1 again. After confirming that the reaction gas in the reactor 1 has been completely removed and the temperature is dropped down, the air-exiting gate 8 is opened for recovering the pressure of the reactor 1 to 1 atm. When all the conditions (temperature, pressure) in the reactor 1 are stable, the substrate 13 can be taken out.

The steps for preparing the catalyst 14 are followed:

1. Firstly, add the solid iron nitrate ($Fe(NO_3)_3$) into water and well mixed.

2. Add ammonium hydroxide slowly into 2-ethyl hexenoic acid solution.

3. Add iron nitrate solution ($Fe(NO_3)_3$ $5H_2O$) (prepared in step 1) slowly into the neutralization solution prepared in step 2 and mix up.

4. Add the solution prepared in step 3 into xylene and well mixed.

5. Stand for a period of time for precipitation, remove the lower layer, and repeat this step for several times.

6. Extraction.

Furthermore, the present invention provides a method for stamping the catalyst 14 onto the substrate 13. The method is described as follows:

1 Set the rotation speeds of the two-section spin coating machine as 1000 rpm and 4000 rpm and operation times thereof as 30 seconds, 2. Power on the spin coating machine, and put the substrate to the suction thereof for fixing thereon.

3. Drop the pre-prepared catalyst solution onto the substrate averagely and stand for 5 seconds. This step is trying to increase the adhesive force between the catalyst and the substrate.

4. Turn on the spin coating machine.

Figure 2:
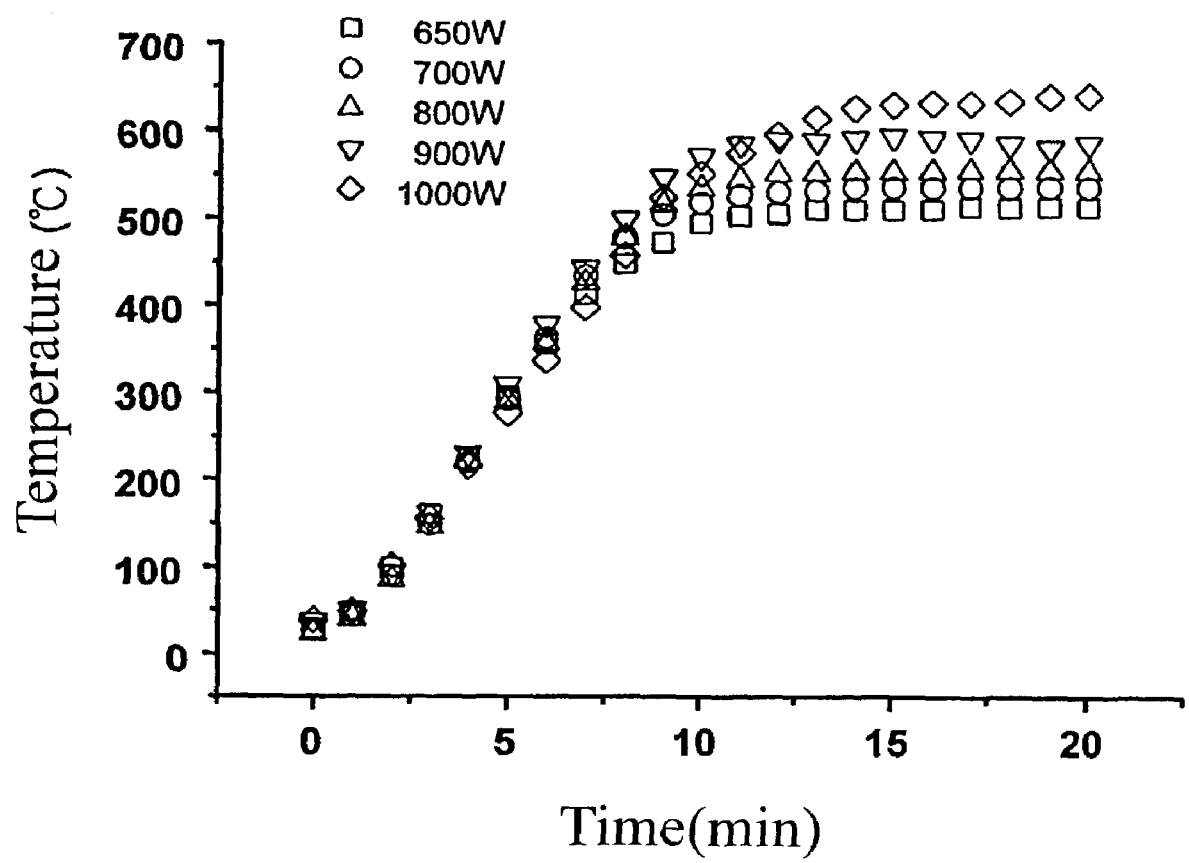
FIG. 2 is a temperature-power-time curve according to the present invention.

As the statements described above, the present invention preferably provides a microwave heating method by employing a material which is microwave absorbable and capable of transmitting the microwave energy into the thermal energy. Also, the material can be the holder of the substrate and can easily raise the temperature of the whole system up to 1000° C. in an extremely short time (less than 10 minutes), as shown in FIG. 2. By way of the physical characteristics of the microwave, some positions, which can absorb the microwave most effectively, can easily be found in the reactor. Thus, if the substrate is posited at the positions thereof, the heating effect will be great. Moreover, the material used to absorb the microwave and then transmit the microwave energy to the thermal energy raises its temperature entirely and averagely, thus it only need to increase the area of the holder of the substrate, and then the purpose of heating large-area material can be achieved.

Figure 3:
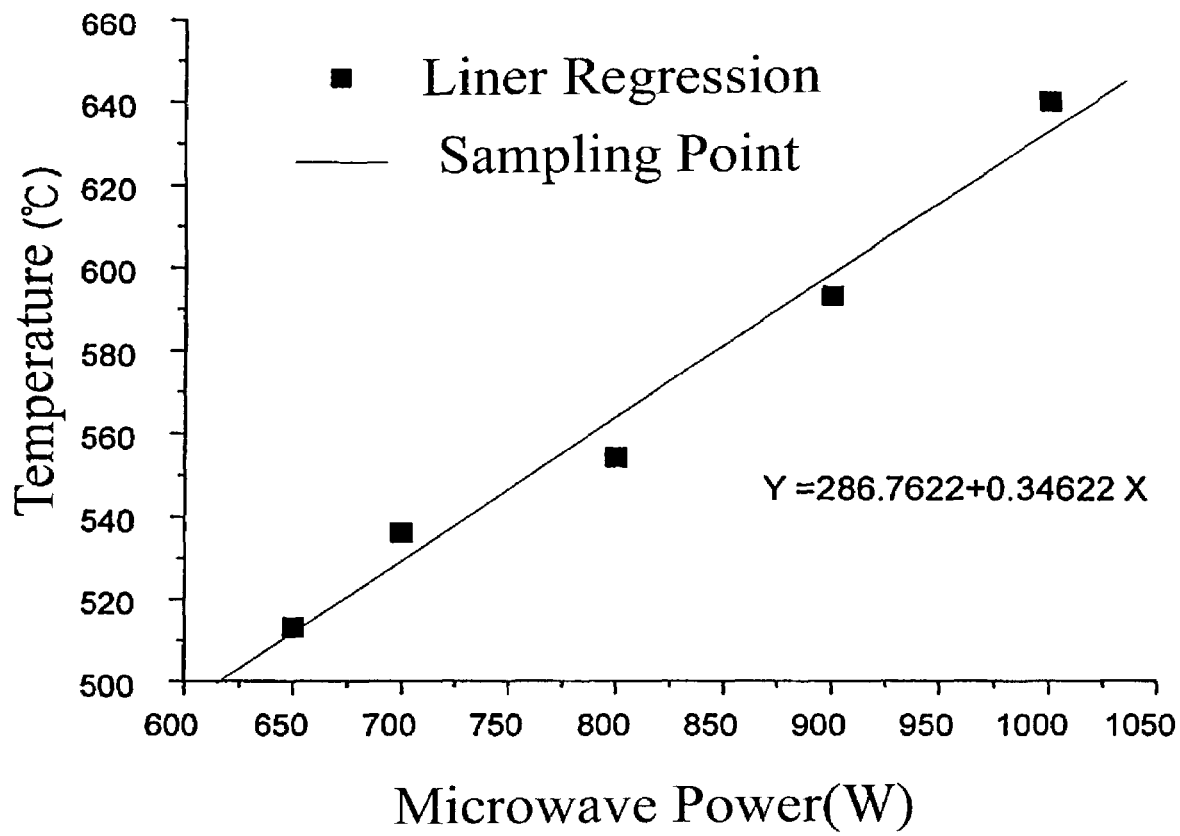
FIG. 3 is a curve of temperature vs. microwave output power according to the present invention.

Besides, the microwave thermal method can be used to control the temperature, too. Because the value of temperature is a function of that of the microwave output power, the temperature can be controlled by controlling the microwave output power. As shown in FIG. 3, the value of temperature of the substrate surface is a liner function of the value of the microwave output power, thus the temperature error can be maintained at ±5 under a fixing power.

Figure 4A:
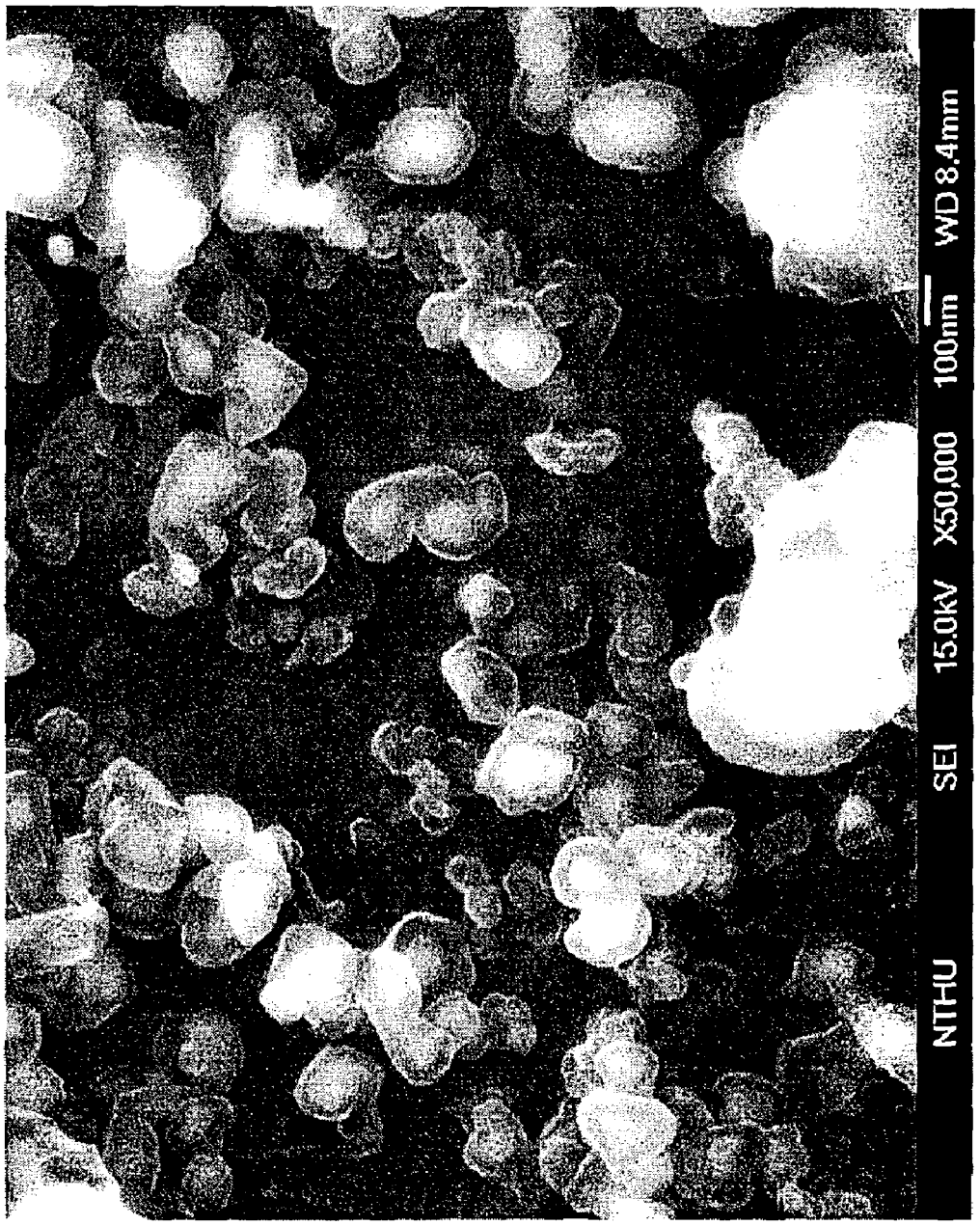
FIG. 4A is a SEM of the surface of the nano-carbon material which grows under 700 W microwave power according to the present invention.
Figure 4B:
FIG. 4B is a SEM of the surface of the nano-carbon material which grows under 900 W microwave power according to the present invention.
Figure 4C:
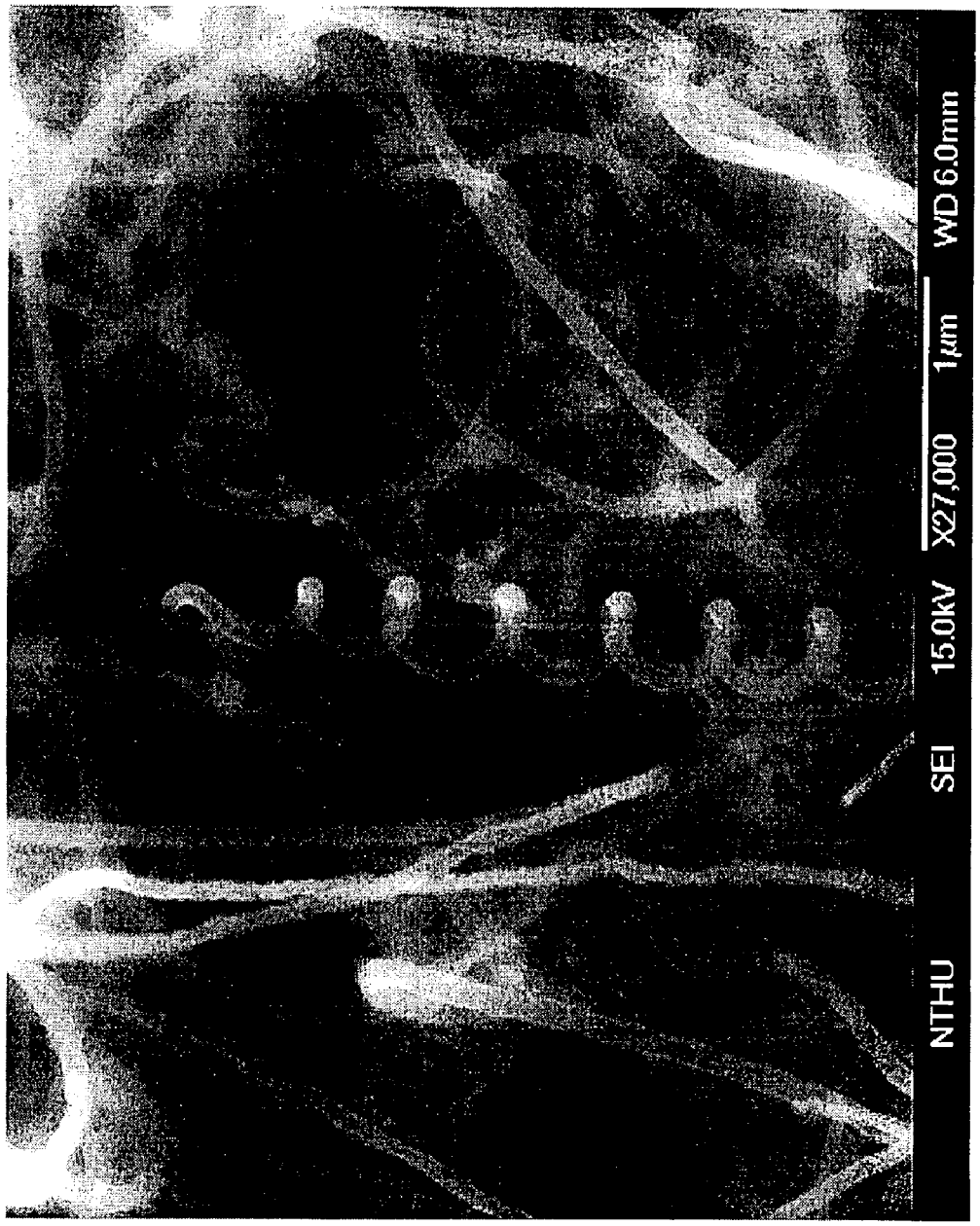
FIG. 4C is a SEM of the surface of the nano-carbon material which grows under 100 W microwave power according to the present invention.

Please refer to FIGS. 4A~4C. FIGS. 4A~4C show the SEMs of the nano-carbon material grown under different microwave power in the preferred embodiments according to the present invention. The growing time is 30 seconds, and the reaction gas is methane ($CH_4$). As shown in FIG. 4A, when the power of the microwave is 700W, the nano-carbon material cannot be observed because the temperature is too low. When the power of the microwave is 900W, some nano-carbon materials are formed with different diameter, as shown in FIG. 4B. Please refer to FIG. 4C, when the power of the microwave is 1000W, the density of the nano-carbon material obviously becomes higher and the diameter thereof is more equally. Consequently, the power of the microwave should be greater than 1000W for being contributive to the growth of the nano-carbon material.

In view of the aforesaid, comparing the process of the present invention with that in the prior art, the present invention has several advantages as follows: (a) the temperature raising speed is fast, so that it can heat the apparatus to the desirable level less than 10 minutes; (b) the temperature of the whole system is heating in part and situation of the high temperature is only around the silicon carbide; (c) the whole area of the silicon carbide is heating averagely; and (d) the thermal area of the substrate is decided by the area of the silicon carbide and thus reduces the limitation of the maximization of the reaction area. The controllability and reliability of the manufacturing process in the present invention can increase the production rate and the yield, and thus the present invention is industrial valuable.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for synthesizing a nano-carbon material comprising steps of:
    a) providing a substrate;
    b) spreading a catalyst on said substrate;
    c) providing a heat generator;
    d) loading said substrate having said catalyst spread thereon above or around said heat generator;
    e) introducing a carbon containing material to said reactor;
    f) introducing microwave energy in said reactor; and
    g) heating said carbon containing material by means of heating the heat generator with the microwave energy to generate a heat energy corresponding to said microwave, thereby pyrolyzing said carbon containing material to provide a carbon source for forming said nano-carbon material on said substrate.

2. A method according to claim 1 wherein said catalyst in step (b) is one selected from the group consisting of a transition element, a compound thereof and a mixture thereof.

3. A method according to claim 1 wherein said spreading method in step (b) is one selected from the group consisting of a spin coating method, a screen printing method, a physical vapor deposition method, a chemical vapor deposition method, and a mixed membrane plating method thereof.

4. A method according to claim 1 wherein said heat generator in step (b1) is made of silicon carbide.

5. A method according to claim 1 wherein said heat generator is loaded into said reactor together with said substrate.

6. A method according to claim 1 wherein said carbon containing material in step (d) is a gas.

7. A method according to claim 6 wherein said gas is an organic gas.

8. A method according to claim 7 wherein said organic gas is one selected from the group consisting of methane, acetylene, and a gas compound containing carbon.

9. A method according to claim 1 wherein said heat energy is formed by an induced current generated by said heat generator in response to said microwave, thereby cracking said carbon containing material.

10. A method according to claim 1 wherein said heat energy is formed by an arc-discharge generated by said heat generator in response to said microwave.

11. A microwave-heated thermal deposition method comprising steps of:
    (a) providing a substrate spread with a catalyst;
    (b) providing a heat generator;
    (c) loading said substrate having said catalyst spread hereon above or around said heat generator into a reactor;

(d) introducing a material into said reactor; and
(e) introducing a microwave into said reactor to employ said heat generator to generate a heat energy in response to said microwave and to pyrolyze said material for providing a material source when growing a substance on said substrate.

12. A method according to claim 11 wherein said catalyst is one selected from the group consisting of a transition element, a compound thereof and a mixture thereof.

13. A method according to claim 11 wherein said spreading method is one selected from the group consisting of a spin coating method, a screen printing method, a physical vapor deposition (PVD) method, a chemical vapor deposition (CVD) method, and a mixed membrane plating method thereof.

14. A method according to claim 11 wherein said heat generator in step (b) is made of a material being able to absorb said microwave and transform a microwave energy into a heat energy.

15. A method according to claim 11 wherein said heat generator is made of silicon carbide.

16. A method according to claim 11 wherein said material in step (d) is a carbon containing material.

17. A method according to claim 16 wherein said carbon containing material is a gas.

18. A method according to claim 17 wherein said gas is an organic gas.

19. A method according to claim 18 wherein said organic gas is one selected from the group consisting of methane, acetylene, and a gas compound containing carbon.

20. A method according to claim 11 wherein said heat energy in step (e) is formed by an induced current generated by said heat generator in response to said microwave.

21. A method according to claim 11 wherein said heat energy in step (e) is formed by an arc-discharge generated by said heat generator in response to said microwave.

22. A method according to claim 11 wherein said substance in step (e) is a nano-carbon material.

23. A method according to claim 11 wherein said material in step (e) is made of carbon.

* * * * *